United States Patent

Shoap

[15] 3,675,236

[45] July 4, 1972

[54] SERIAL GRAY-TO-BINARY TRANSLATOR WITH CLOCK TRANSITION TIMING

[72] Inventor: Stephen Davis Shoap, Matawan, N.J.

[73] Assignee: Bell Telephone Laboratories Incorporated, Murray Hill, N.J.

[22] Filed: Sept. 2, 1970

[21] Appl. No.: 68,904

[52] U.S. Cl. ........................................340/347 DD, 235/155

[51] Int. Cl. ........................................................H03k 13/24

[58] Field of Search.....................340/347, 347 DD; 235/155

[56] References Cited

UNITED STATES PATENTS

| | | | |
|---|---|---|---|
| 2,791,764 | 5/1957 | Gray, Jr. et al. | 340/347 |
| 2,975,409 | 3/1961 | Petherick | 340/347 |
| 2,755,459 | 7/1956 | Carbrey | 340/347 |
| 2,983,913 | 5/1961 | Zdanowich | 340/347 |
| 2,982,953 | 5/1961 | Cadden et al. | 340/347 |
| 2,711,499 | 6/1955 | Lippel | 340/347 |

*Primary Examiner*—Maynard R. Wilbur
*Assistant Examiner*—Charles D. Miller
*Attorney*—R. J. Guenther and E. W. Adams, Jr.

[57] ABSTRACT

A Gray-to-Binary code converter relies on clock transition sampling, rather than requiring coincidence of pulse width and pulse phase. Half-period timing signals are complemented and used for precise time delays. Discrete conversion control apparatus under control of the timing signals presets conversion apparatus for translation in accordance with a multi-equation conversion algorithm.

6 Claims, 11 Drawing Figures

INVENTOR
S. D. SHOAP
BY Daniel D. Dubosky
ATTORNEY

SERIAL GRAY-TO-BINARY TRANSLATOR WITH CLOCK TRANSITION TIMING

BACKGROUND OF THE INVENTION

This invention relates to digital code converters. In particular, the principles of the present invention may be advantageously applied to apparatus for converting Gray codes to binary codes.

The term Gray code designates a class of binary codes in which only one digit changes state during each counting step. The binary code, on the other hand, is the common binary counting code (i.e., 000, 001, 010, 011, etc.).

With the recent proliferation of digital computers and digital information systems, the choice of digital codes to be used has assumed increasing importance. In seeking to improve the efficiency of operation of the systems, it has been found that certain portions of digital systems operate more efficiently with particular codes. For example, the Gray code is a logical and efficient choice for use at the analog signal encoding stage of the system, while the binary code is a superior choice for the decoding stages of the system.

Thus, due to the advantages to be accrued from having analog data represented by various codes in different parts of a system, a need has arisen for fast, accurate and relatively simple code conversion apparatus. Typically, the conversion is accomplished in accordance with a conversion algorithm comprising more than one equation. Each of the equations represents the procedure to be followed for the conversion of particular ones of the digits of the code to be converted.

One type of digital code converter which has appeared extensively in the prior art is the so-called shaft, or disc converter. Shaft or disc converters are electromechanical devices which convert digits of one code type to corresponding digits of another code by varying the angle of a shaft to which is connected a disc upon which are printed metallized patterns corresponding to codes. Electrical brushes are tangent to portions of the disc and provide digital "1s" or "0s," depending upon whether they touch a conducting or insulating section of the disc. Disc converters, however, have been proven to be lacking in speed, accuracy, and reliability.

More recently, electronic techniques and devices have successfully improved the code converter art. The consequence of the application of electronics to code converters has been superior speed, reliability and accuracy of conversion. Typically, electronic converters may take serial or parallel form, and are made up of combinations of logic gates and flip-flops. These components are synthesized in accordance with a design procedure which utilizes truth tables, Karnaugh maps and switching functions. In any case, electronic code converters are intended for operation at very high speeds.

Multiple equation algorithm electronic converters generally require as a logical imperative at least three separate types of signals: the digital signal to be converted, timing signals, and signals for indicating the algorithm equation to which particular digits correspond. The prior art converters generally operate by requiring a coincidence of occurrence of some or all of the respective signals. For example, a coincidence of a digital pulse, a clock pulse, and an indicating pulse may designate a particular algorithm equation, whereas a coincidence of only a signal pulse and a clock pulse may designate another equation.

This requirement of coincidence of pulse durations may bring about severe limitations in converter operating speeds. Generally, to insure proper coincidence of respective pulse durations, converters are designed with signal pulses of varying lengths. This tends to bring about a small relaxation with respect to allowable time delays through the system. Usually, transmitting the signals over separate paths subjects them to uneven time delays and therefore to significant differences in phase relative to one another. This in turn tends to restrict the operating speed of the system, thereby working against the overall goals of high conversion speeds and accuracy.

In summary, the high speed requirement of the prior art converters makes timing critical and the requirement of coincident occurrence of pulses tends to work in opposition to high speed operation. To minimize this conflict, prior art converters require a design which provides pulses of varying width operating with carefully controlled time delays.

SUMMARY OF THE INVENTION

The present invention is a Gray-to-Binary code converter which eliminates many of the serious difficulties of the prior art converters. The present invention provides superior performance by sampling pulses with the transition portions of the timing signals, rather than requiring simultaneous occurrence of pulses. Thus, converters embodying principles of the present invention do not require pulses of varying width, thereby reducing time delay constraints. Accordingly, complemented clock pulses may be used for a carefully controlled time delay. Due to these functional improvements over the prior art converters, converters embodying the principles of the present invention can actually anticipate the algorithm equation which will be appropriate. Accordingly, the present invention provides a discrete control block which operates alternative conversion means in accordance with the anticipated algorithm equation.

Due to these structural and functional characteristics, converters embodying the principles of the present invention may operate at high speeds with considerable accuracy without encountering problems of time delay sensitivity. Moreover, this permits the converters to operate with considerable functional and structural simplicity.

In an illustrative embodiment of the present invention, Gray code signals, half period (i.e., 50 percent duty cycle) clock pulses, and "new word" indicating signals are each complemented. The leading edges of the clock pulses sample the Gray code signals and Gray code complement, and the leading edges of the complement of the clock pulses sample the new word indicating signals and their complement. Whenever the sampling of the new word signal by the clock complement indicates the forthcoming initiation of a new Gray code word, a conversion control means is enabled, which means in turn presets two alternate code conversion means in accordance with one of the algorithm equations. Otherwise, the two conversion means operate in accordance with another algorithm equation. The sampled Gray code signals are then conveyed at the clock rate to the conversion means for translation to binary code signals.

It is a feature of the present invention that various gating configurations are utilized to obtain a reduction in relative pulse width and pulse phase dependency in digital code converters. Moreover, the present invention features notably high conversion rates without penalty to conversion accuracy. Several ancillary features are included in the invention, including provision for reducing critical races between parallel apparatus. These and other features of the present invention will be more readily apparent when the following detailed description is considered in conjunction with the drawings.

DETAILED DESCRIPTION

As was indicated hereinbefore, Gray codes broadly include any codes in which only one digit changes in each counting step. However, certain particular Gray codes have proven more advantageous than others. One of these advantageous Gray codes upon which the present invention is intended to operate may be defined by its relationship to the binary numbers to which a Gray code signal is converted. The following algorithm describes a Gray-to-Binary conversion which may be achieved by the present invention:

$$b_1 = g_1 \text{ for } k = 1 \quad 1.$$

$$b_k = b_{k-1}\,\overline{g_k} + \overline{b_{k-1}}\,g_k \text{ for } k > 1 \quad 2.$$

where $b_k$ is the $k^{th}$ digit in the output binary word, $g_k$ is the $k^{th}$ digit in the input Gray code word, and $k = 1$ signifies the most significant digit in a word. A bar over a particular Gray or binary digit represents the complement of that digit.

The algorithm given by equations 1 and 2 may be interpreted as follows. The first Gray digit is converted directly to the first binary digit. For succeeding Gray digits, equation 2 applies. That is, if the Gray digit is a logical "0," the corresponding binary digit does not change in value from the previous binary digit, and if the Gray digit is a logical "1," the corresponding binary digit is the complement of the previous binary digit. Thus, for all digits except the first Gray digit, the binary digit is said to "toggle" on Gray "1s."

Figure 1:
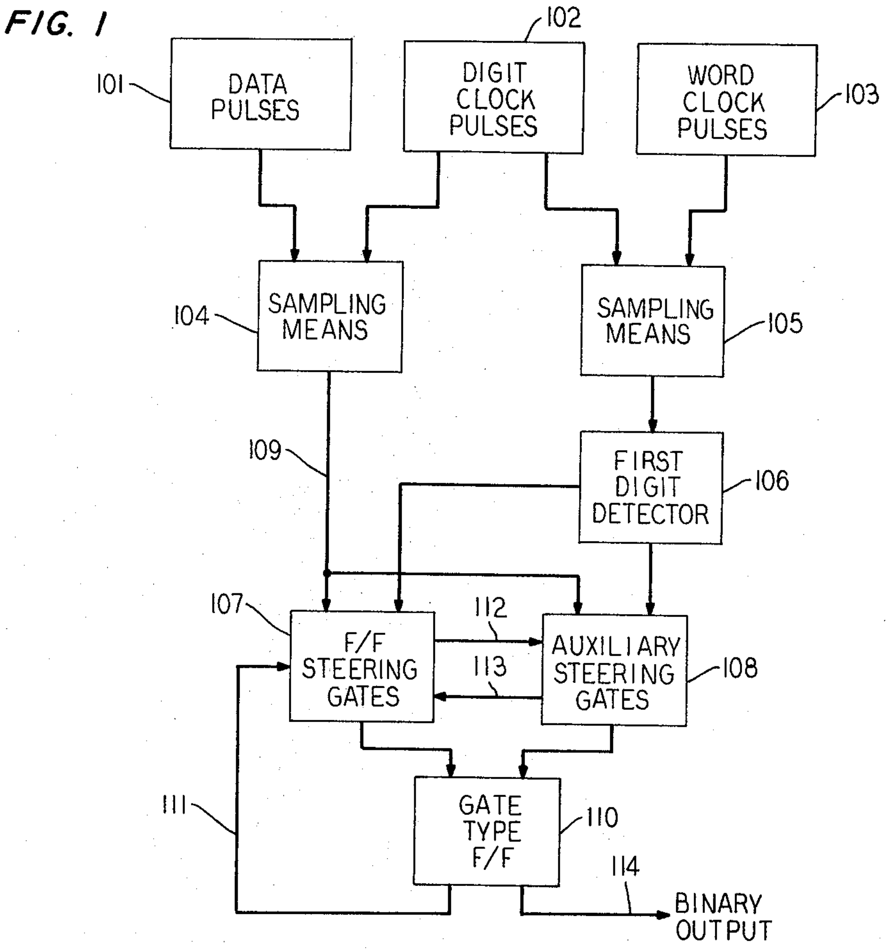
FIG. 1 is a block diagram of a Gray-to-Binary code converter which embodies the principles of the present invention.

FIG. 1 shows in block diagrammatic form a Gray-to-Binary code converter which embodies the principles of the present invention. Pulse signals are received by the converter from three separate sources. The Gray code digits to be converted are received from the source of data pulses 101, and timing pulses are received from a digit clock 102 and a word clock 103. The pulses from the digit clock 102 represent the timing pulses for the embodiment of FIG. 1, while the pulses from the word clock 103 serve as markers for determining transitions between Gray code words.

The Gray code pulses are sampled by the transition portion of pulses from the digit clock 102 in a first sampling means 104, thereby synchronizing them for the proper timing operation of the invention. In addition, the pulses from the word clock 103 are sampled by pulses from the digit clock 102 in a second sampling means 105.

Once the word clock pulses have been sampled, they are transmitted to a first digit detector 106. It is a function of the first digit detector to indicate whether the conversion of the anticipated Gray code digit is to be in accordance with equation (1) or equation (2) of the above-mentioned algorithm. That is, if the first digit detector 106 notes the presence of a sampled word clock pulse, indicating that the first digit of a new Gray word is forthcoming, it indicates that equation (1) is to be utilized; otherwise, equation (2) is to be utilized. Accordingly, the first digit detector emits control pulses to enable either the flip-flop steering gates 107 or the auxiliary steering gates 108. Thus, if the forthcoming digit to be converted is the first digit of a Gray word, the auxiliary steering gates 108 are enabled by the first digit detector 106, and the flip-flop steering gates are inhibited. Otherwise, the flip-flop gates 107 are enabled and the auxiliary steering gates 108 are inhibited.

As the conditions of the flip-flop steering gates 107 and the auxiliary steering gates 108 are determined by the first digit detector 106, the sampled Gray code pulses are transmitted from the first sampling means 104 onto line 109. Thus, the Gray code digit will be converted to binary either by the flip-flop steering gates 107 or the auxiliary steering gates 108, whichever has been enabled.

Suppose, for example, that the first digit detector 106 has enabled auxiliary steering gates 108 and inhibited the flip-flop steering gates 107. The corresponding sampled Gray digit then operates the auxiliary steering gates 108 and either a pulse or no pulse is applied to the gate type flip-flop 110, depending upon whether the Gray digit is a "1" or "0," respectively. If, on the other hand, the first digit detector 106 has enabled the flip-flop steering gates 107 because the incoming sampled Gray digit is not the first digit of a Gray word, the Gray code data operates the flip-flop steering gates 107 in accordance with algorithm equation (2). Thus, for all digits except the first digit of a Gray word, the gate type flip-flop 110 is toggled by incoming Gray "1s" on line 109.

The gate type flip-flop 110 serves a dual function. First, the output state of flip-flop 110 at terminal 114 represents the converted binary output digit. In addition, the output state of flip-flop 110 causes the flip-flop steering gates 107 to toggle flip-flop 110 via line 111 by providing the $b_{k-1}$ digit for every $b_k$ digit presented at the input of the flip-flop steering gates 107.

In the discussion of the embodiment of FIG. 1, little concern has been given to the relative timing and time delays to be encountered by signal and clock pulses as they pass through the apparatus. This very critical aspect of the converter operation is discussed in detail hereinafter.

The interconnections 112 and 113 between the flip-flop steering gates 107 and the auxilliary steering gates 108 provide an antirace function. This function tends to ensure that the Gray code pulses will be converted by the proper set of gates 107 or 108, in accordance with the proper algorithm equation 1 or 2, by locking the gates to be inhibited in a low, or disabled, state.

Figure 2:
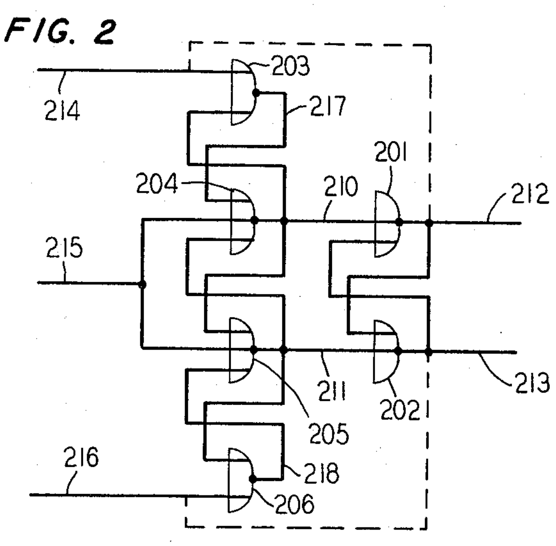
FIG. 2 is a schematic diagram of a logic circuit which is used in a preferred embodiment of the invention.

FIG. 2 shows a schematic diagram of a logic circuit which is utilized in a preferred embodiment of the converter shown in FIG. 1. The circuit of FIG. 2 is a permutation of the circuits described in Chapter 11 of "*The Logical Design of Transistor Digital Computers*" by Maley and Earle, Prentice Hall, 1963. The circuit of FIG. 2 may be properly divided into two basic parts: a gate type flip-flop comprising NOR gates 201 and 202, and a pulsed steering configuration comprising NOR gates 203, 204, 205, and 206. The operation of the circuit of FIG. 2 will be discussed insofar as it applies to the operation of the present invention. Therefore, an assumption is made that the signal at terminal 214 is at all times the complement of the signal at terminal 216.

NOR gates 201 and 202 function as a flip-flop by utilizing the basic operating characteristic of NOR gates. A NOR gate is defined as providing at its output a logical "1" only if all of its input terminals are logical "0s." Thus, if a pulse having a voltage equivalent to a logical "1" is received at terminal 210 while terminal 211 is a logical "0," output terminal 212 of gate 201 is forced to a logical "0," which in turn causes output terminal 213 of gate 202 to go to a logical "1." This, in turn, locks terminal 212 into a logical "0" state for the time after the pulse at terminal 210 has terminated. A similar situation takes place when a pulse occurs at terminal 211, with terminal 213 being locked in a logical "0" state and terminal 212 being locked in a logical "1" state. Flip-flop action is thereby attained.

NOR gates 203, 204, 205, and 206 function as a steering circuit for the flip-flop comprising NOR gates 201 and 202. Whenever the input lead 215 to gates 204 and 205 is in a logical "1" condition, terminals 210 and 211 remain in a logical "0" condition, regardless of the signals appearing at terminals 214 and 216. However, when a logical "0" condition appears at terminal 215, the state of terminals 214 and 216 determines the signal which appears at terminals 210 and 211. For example, if terminal 214 is a logical "1" (and terminal 216 is therefore a logical "0," the initiation of a logical "0" at terminal 215 causes a logical "1" condition at terminal 210, which in turn switches the flip-flop comprising gates 201 and 202 into the state in which terminal 212 is a logical "0" and terminal 213 is a logical "1." Similarly, whenever terminal 216 is a logical "1" (and terminal 214 is therefore a logical "0"), a logical "1" condition appears at terminal 211 whenever a logical "0" is initiated at terminal 215, and the flip-flop comprising gates 201 and 202 is consequently switched into the state in which terminal 212 is a logical "1" and terminal 213 is a logical "0." This operation of NOR gates 203, 204, 205, and 206 is defined as a sampling operation, and the signal at terminal 215 is said to sample the signals at terminals 214 and 216.

One feature of the circuit of FIG. 2 is especially important to note. If terminal 212 is connected with terminal 214 and terminal 213 is connected with terminal 216, the circuit of FIG. 2 is said to be connected in a toggling arrangement. When a logical "0" pulse is received on input terminal 215, it samples the voltage at terminals 214 and 216 (and therefore 212 and 213), as described above, and places a pulse on either of terminals 210 or 211, depending upon whether terminal 214 or 216, respectively, is a logical "1." Such a pulse at terminal 210 or 211 then causes the flip-flop comprising gates 201 or 202 to change state as described above. For example, if the connection of terminals 212 and 214 is a logical "1" and the connection of terminals 213 and 216 is a logical "0," a sampling pulse on input terminal 215 initiates a logical "1" condition at terminal 210. This, in turn, causes the connection of terminals 212 and 214 to go to a logical "0" state, and the connection of terminals 213 and 216 to go to a logical "1" state. Such an operation corresponds to the toggling definition of equation (2) (i.e., if the signal at terminal 215 is changed to a logical "0," the state of terminals 212 and 213 changes; if the signal at terminal 215 is a logical "1," the state of terminals 212 and 213 is unchanged).

Figure 3:
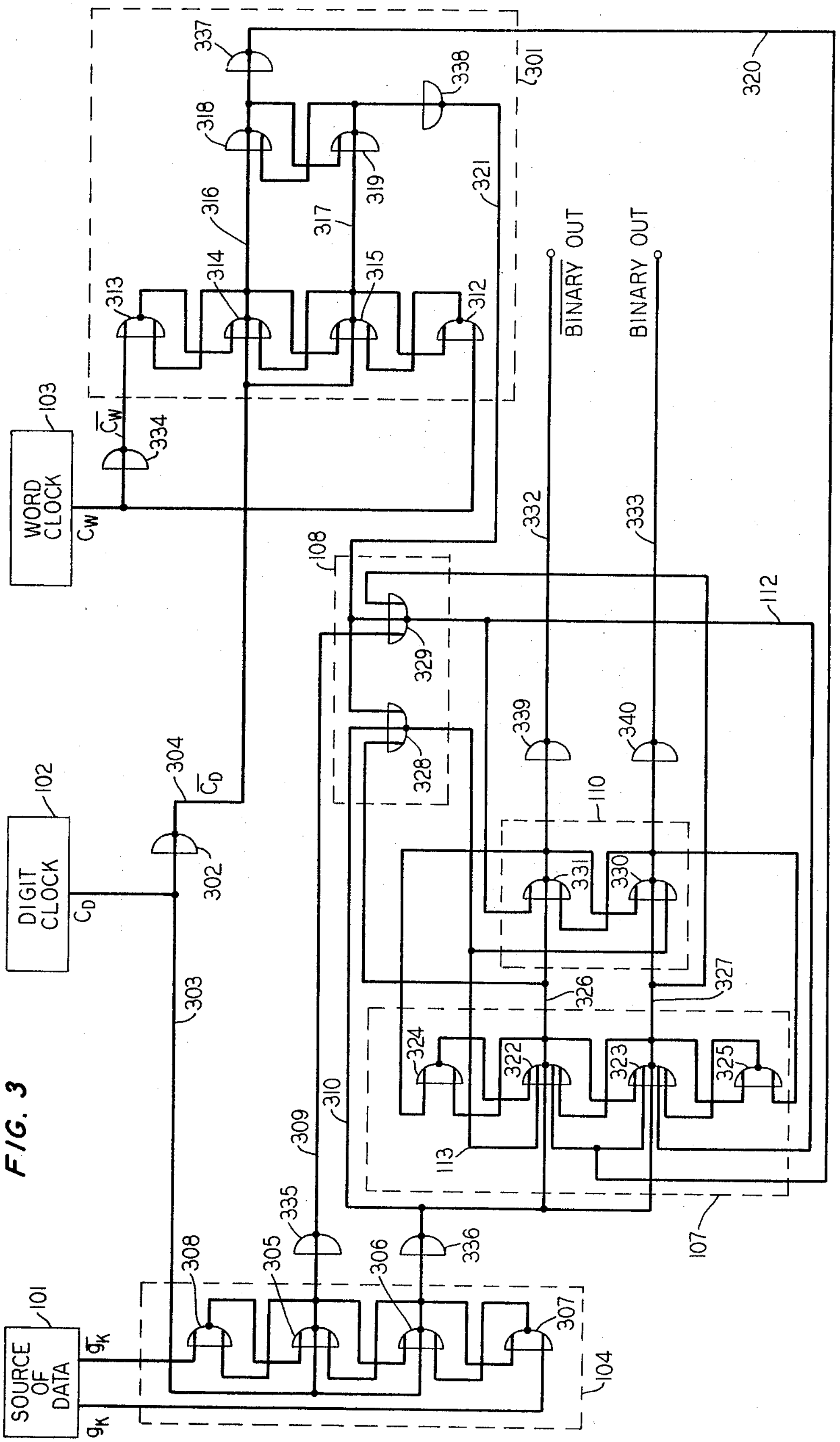
FIG. 3 is a schematic diagram of a preferred embodiment of the converter shown in FIG. 1.

FIG. 3 shows a schematic diagram of a preferred embodiment of the converter which is shown in block diagrammatic form in FIG. 1. For convenience and clarity of explanation, the functional blocks shown in FIG. 1 are delineated in FIG. 4 bv dashed lines and with the same numbers. An exception is the inclusion of the second sampling means 105 and the first digit detector 106 into a combined sampling means and first digit detector 301.

It should be evident that the embodiment shown in FIG. 3 relies heavily on circuit forms which are similar to the circuit of FIG. 2. The functioning of these circuits is also quite analogous to those described for the circuit of FIG. 2. Therefore, for the following description, blocks of gates will be treated together, where the operation is similar to that of the circuit of FIG. 2.

Figures 4A, 4B, 4C, 4D, 4E, 4F, 4G, 4H:
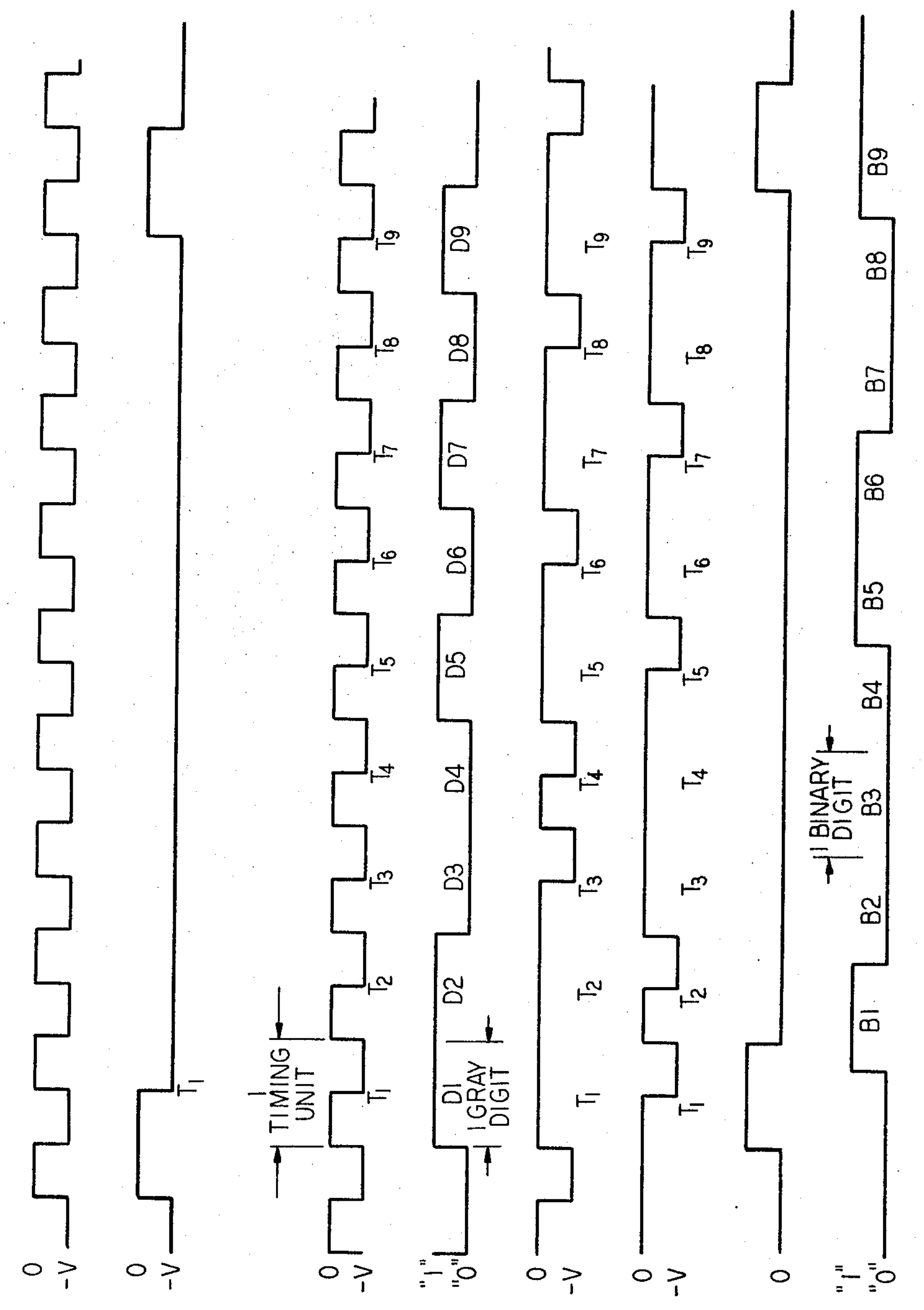
FIGS. 4A through 4H show voltage waveforms which relate to the operation of the embodiment of FIG. 3.

The operation of the embodiment of FIG. 3 may be more easily understood if it is considered in conjunction with the waveforms shown in FIGS. 4A through 4H. FIG. 4A shows the voltage waveform of the complement of the signal from the digit clock 102. FIG. 4B shows the voltage signal from the word clock 103. FIG. 4C shows the voltage signal from the digit clock 102. FIG. 4D shows a typical Gray code signal from the source of data pulses 101. FIG. 4E shows the logical "0" digits from the waveform of the Gray data (FIG. 4D) as sampled by the digit clock pulses (FIG. 4C). FIG. 4F shows the logical "1" digits from the waveform of the Gray code data (FIG. 4D) sampled by the digit clock pulses (FIG. 4C). FIG. 4G shows the waveform of the word clock pulses (FIG. 4B) sampled by the complement of the digit clock pulses (FIG. 4A). FIG. 4H shows the binary output signals.

The operation of the embodiment of FIG. 3 proceeds as follows. The principle timing function is directed by the digit clock 102, which produces clock pulses (FIG. 4C) and their complement (FIG. 4A) at lines 303 and 304, respectively. The complementing function is accomplished by an inverter 302. Throughout FIG. 4, the gates 334, 335, 336, 337, 338, 339, and 340 are included to perform an inverting function.

The digit clock pulses (FIG. 4C) are transmitted to NOR gates 305 and 306 of the first synchronization means to sample the Gray code signal (FIG. 4D). It is the negative-going edge of a clock pulse which does the sampling. Thus, the digit clock signal of FIG. 4C samples the Gray code pulse signal at times $T_1$, $T_2$, $T_3$, etc. Due to this superior sampling technique, the sampling edge of the digit clock pulse need only occur at any time during the entire duration of the Gray digit to be sampled ($D_1$, $D_2$, $D_3$, etc.). Whenever the Gray digit to be converted is a "1" (e.g., $D_1$, $D_2$, $D_5$, $D_7$ and $D_9$), the sampling of the Gray code logical "1" digits by the clock pulse ($T_1$, $T_2$, $T_5$, $T_7$ and $T_9$) causes pulses to be produced at line 310 (FIG. 4F). For this reason, line 310 will be defined as a "one bus," indicating that whenever a pulse appears at line 310, the corresponding Gray code digit is a logical "1." Similarly, when the Gray code digit is a "0" ($T_3$, $T_4$, $T_6$, and $T_8$) a pulse appears at line 309 as shown in waveform of FIG. 4E. Therefore, line 309 is defined as a "0" bus indicating that a pulse occurs at line 309 whenever the corresponding Gray digit is a logical "0."

In summary, negative-going pulses as shown in FIGS. 4E and 4F, appear on the zero bus and the one bus, respectively, depending upon the state of the Gray code data digits at the occurrence of a negative-going voltage transient in the sampling digital clock pulse train (FIG. 4C).

Due to the clock pulse transition sampling utilized by the present invention, it is unnecessary to provide clock, indicating, and data pulses of varying lengths. Consequently, the embodiment of FIG. 3 is designed utilizing clock pulses with a 50 percent duty cycle (i.e., half period pulses). The use of 50 percent duty cycle timing in turn allows for the feature of the present invention of allowing for a discrete control unit which operates in a predictive mode. That is, since the clock signals comprise half period pulses, the complement of the clock pulse signal may be appropriately though of as a half period phase advancement of the clock pulse signal. Therefore, a negative going voltage transition in the complement of the clock pulses may be appropriately thought of as a precise half period advanced prediction of a negative-going voltage transient in the clock pulse signal. This fact may be taken into account by a discrete control unit, the detailed embodiment of which shall be described hereinafter.

A sampling operation similar to the one which occurs in the first sampling means 104 also occurs in the second sampling means and first digit detector 301. At the second sampling means and first digit detector 301, however, it is the complement of the digital clock pulses (FIG. 4A) which samples the word clock pulses (FIG. 4B). Since the sampling transient of the complement pulses occurs one-half clock period ahead of the corresponding sampling transient of the clock pulses, a sampling at the second sampling means and first digit detector 301, indicating the forthcoming initiation of a new Gray code word, allows the second sampling means and first digit detector 301 to effectively predict the initiation of a new word and to prepare the code conversion circuitry comprising the flip-flop gates 107 and the auxiliary gates 108 to accomplish the Gray-to-binary conversion.

The complementary clock pulses (FIG. 4A) are transmitted via line 304 as sampling inputs to NOR gates 314 and 315. The signal waveforms appearing at terminals 316 and 317 are therefore dependent upon the sampling of the word clock signal by the complement of the digit clock signal, the pulses at terminals 316 and 317 operating the flip-flop comprising NOR gates 318 and 319. The waveform of FIG. 4G represents the sampled word pulses at line 320.

The waveform of FIG. 4G may be interpreted as follows. Whenever a word clock pulse is sampled by a digit clock pulse, indicating a transition between Gray code words, a pulse occurs at line 316 and line 320 is therefore forced into a logical "1" state. At all other times, line 320 is in a logical "0" state and line 321 is in a logical "1" state.

Upon the occurrence of a word clock pulse, indicating transition between Gray code words, the logical "1" resulting from the sampled word clock signal which occurs at line 320 (FIG. 4G) is transmitted to NOR gates 322 and 323 of the flip-flop steering gates 107 and thereby disables these gates from reacting to any logical "0s" which may be provided to one of their other inputs. Moreover, as may be recalled from the explanation of the operation of the circuit of FIG. 2, the disabling of gates 322 and 323 disables the flip-flop steering gates 107 thereby prohibiting any Gray code signals at the one bus 310 from toggling the configuration of NOR gates 322, 323, 324, 325, 330, and 331. However, when the steering gates 107 are disabled, line 321 is in a logical "0" state, thereby allowing the auxiliary steering gates 108 to be enabled, depending upon the state of the sampled Gray code signal on the zero bus 309 and the one bus 310. If the first Gray digit is a "1," thereby placing a pulse on the one bus, NOR gate 328 is enabled; otherwise NOR gate 329 is enabled.

The output terminals of the two NOR gates 328 and 329 which comprise the auxiliary steering gates 108 lead to the input terminals 326 and 327 of the gate type flip-flop 110 as well as to NOR gates 322 and 323. The connection to gates 322 and 323 provides the aforementioned antirace function. That is, a pulse from NOR gate 328 or 329, whichever has been enabled, is transmitted to the input of either of the NOR gates 322 or 323, respectively, thereby insuring that the flip-flop steering gates 107 are inhibited. Thus, the very signal which is converted to the first binary digit in accordance with algorithm equation 1 also controls the flip-flop gates 107, thereby prohibiting any conversion in accordance with algorithm equation 2. The pulses from the auxiliary steering gates 108 drive the gate type flip-flop 110 to provide the binary output at terminals 332 and 333.

In summary, then, the occurrence of a word clock pulse, indicating the first digit of a Gray code word, causes flip-flop steering gates 107 to be inhibited and the auxiliary steering gates 108 to be enabled in anticipation of the first sampled Gray digit. In turn, the auxiliary steering gates 108 operate the gate type flip-flop 110 implementing equation 1 of the conversion algorithm.

When the anticipated digit to be converted is not in the first digit of a Gray code word, line 320 is forced to a logical "0" condition and line 321 to a logical "1" condition, thereby inhibiting the auxiliary steering gates 108 and enabling NOR gates 322 and 323 of the flip-flop steering gates 107. This enabling of the flip-flop steering gates 107 allows the sampled Gray code digits (FIG. 4D) to toggle on "1s," the toggling configuration comprising flip-flop steering gates 107 and the gate type flip-flop 110. This toggling operation proceeds in the same manner as that described in conjunction with FIG. 2. Thus, whenever the anticipated Gray code digit is a "1," resulting in a pulse on the one bus, the flip-flop steering gates 107 and the gate type flip-flop 110 are toggled as above described in connection with FIG. 2. The corresponding binary output signal is shown at FIG. 4H. As may be recalled from the discussion of the circuit of FIG. 2, this toggling operation corresponds to an embodiment of equation (2) of the conversion algorithm.

In summary, in the absence of an anticipated pulse from the word clock 103, the auxiliary steering gates 108 are inhibited by the logical "1" condition on terminal 321 and the flip-flop steering gates 107 are enabled, allowing pulses on the one bus 310 to toggle the configuration of the flip-flop steering gates 107 and the gate type flip-flop 110.

It is to be understood that the above-described circuits are illustrative of the application of the principles of the invention. Numerous other arrangements may be devised by those skilled in the art without departing from the spirit and scope of the invention.

I claim:

1. A serial gray to binary translator for decoding the digital words in a data signal having digit durations of a predetermined interval, said translator comprising:

- a source of digit timing pulses which provides at least one voltage transition during each of said digit durations and which also provides the complements of said digit timing pulses;
- a source of word timing pulses which provides at least a portion of a pulse during a first digit in each of said digital words;
- means responsive to said voltage transition for providing synchronized digital pulses which indicate the logical zeroes and ones of said data signal;
- means responsive to the complement of said digit timing pulses and to said word timing pulses for providing during a first digit a synchronized word pulse; and
- pulse processing means responsive to said synchronized digital pulses and to said synchronized word pulses for providing at its output a decoding of said data signal.

2. A translator as defined in claim 1 wherein said pulse processing means comprises:

- first and second decoding means, each operating in accordance with a decoding algorithm and each having a control input which disables decoding when activated; and
- means for coupling said synchronized word pulse to the control input of each of said decoding means.

3. A digital translator for converting Gray code signals to corresponding binary code signals in accordance with a conversion algorithm defined by first and second equations comprising:

- a source of an indicating signal having pulses associated with corresponding digits of the Gray code signals, said indicating signal designating the one of said equations which defines the conversion procedure for each of the Gray code digits;
- a source of timing pulses, each of said timing pulses having at least one voltage transition during each of the Gray code digits;
- means for developing the complement of the timing pulses, each pulse in said complement having at least one voltage transition occurring during each pulse of said indicating signal;
- means responsive to a voltage transition in the complement of the timing pulses for sampling the indicating signal;
- means responsive to a voltage transition in the timing pulses, for sampling the Gray code signals, a Gray digit being sampled subsequent to the sampling of an associated pulse of the indicating signal;
- first and second decoding means, the operation of each of said decoding means being defined respectively by said equations; and
- conversion control means responsive to said sampled indicating signals for controlling the operation of said decoding means, said conversion control means enabling one of said decoding means and disabling the other of said decoding means;
- whereby a voltage transition of the complement of said timing pulses enables the decoding means predictively to anticipate the desired conversion procedure for the corresponding digit to be translated upon the occurrence of a voltage transition of the associated timing pulse.

4. A digital translator as claimed in claim 3 wherein a first one of said decoding means comprises means for storing converted binary digits and means, responsive to said sampled Gray code digits and to a preceding one of said stored binary digits, for producing a subsequent binary digit, said subsequent digit being identical to said preceding digit whenever the corresponding Gray code digit is a logical zero and said subsequent digit being the complement of said preceding binary digit whenever the corresponding Gray code digit is a logical one.

5. A digital translator as claimed in claim 3 wherein said means for sampling the indicating signal and said means for sampling the Gray code signals each comprises first, second, third, and fourth gating means, the output of each of said gating means being connected to inputs of preceding and succeeding ones of said gating means, sampling signals being applied at the inputs of said second and third gating means and signals to be sampled being applied at the inputs of said first and fourth gating means, sampled signals appearing at the outputs of said second and third gating means.

6. A serial digital translator for converting gray coded words having a plurality of digital bits to corresponding binary code in accordance with a conversion algorithm defined by first and second equations comprising:

- first and second decoding means, each respectively operating in accordance with the procedures defined by said first and second equations;
- a source of digit timing signals, each signal corresponding to a digital bit and having first and second voltage levels during each digital bit time;
- a source of signals for providing predetermined logical states during predetermined bits of said digital word, said logical states indicating which of said decoding means is to be utilized
- means responsive to a change to said first voltage level and to the logical state of said source of signals, for enabling one of said decoding means and for disabling the other of said decoding means; and means responsive to a change to said second voltage level of said digital timing pulses for coupling the corresponding digital bit in said digital word to each of said decoding means.

* * * * *